(12) United States Patent
Anikitchev

(10) Patent No.: US 8,014,427 B1
(45) Date of Patent: Sep. 6, 2011

(54) LINE IMAGING SYSTEMS AND METHODS FOR LASER ANNEALING

(75) Inventor: Serguei Anikitchev, Belmont, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 12/800,203

(22) Filed: May 11, 2010

(51) Int. Cl.
*H01S 3/10* (2006.01)
(52) U.S. Cl. .......................................... 372/9
(58) Field of Classification Search ........................ None
See application file for complete search history.

(56) References Cited

U.S. PATENT DOCUMENTS

| | | | |
|---|---|---|---|
| 6,768,764 B2 | 7/2004 | Schulz et al. | |
| 7,016,393 B2 * | 3/2006 | Anikitchev et al. | 372/101 |
| 2005/0063428 A1 * | 3/2005 | Anikitchev et al. | 372/9 |

* cited by examiner

*Primary Examiner* — Charles D Garber
*Assistant Examiner* — Andre' C Stevenson
(74) *Attorney, Agent, or Firm* — Opticus IP Law PLLC

(57) ABSTRACT

The line imaging system includes a laser, first and second cylindrical optical systems with a first spatial filter disposed therebetween, a knife-edge aperture, a cylindrical relay system, and a cylindrical focusing lens. The first spatial filter is configured to truncate a line focus within the central lobe to form a first light beam. The second cylindrical lens system is arranged in the far field and is configured to perform spatial filtering to pass central intensity lobes of the first light beam while blocking outlying intensity lobes. The resultant twice-filtered light beam is has a relatively flat-top intensity distribution associated with the long direction of the line image so that subsequent truncation by the knife-edge aperture transmits more light than conventional line imaging systems. A laser annealing system that employs the line imaging system is also disclosed.

20 Claims, 14 Drawing Sheets

X-direction pupil coordinate (mm)

LINE IMAGING SYSTEMS AND METHODS FOR LASER ANNEALING

FIELD

The present disclosure relates generally to the formation of line images using light beams, and in particular to systems and methods for improved line imaging for laser annealing applications.

BACKGROUND ART

There is a variety of applications that require the use of a uniform line image formed from a coherent light beam. One such application is laser thermal processing (LTP), also referred to in the art as laser spike annealing (LSA) or just "laser annealing," which is used in semiconductor manufacturing to activate dopants in select regions of a semiconductor wafer when forming active microcircuit devices such as transistors. Laser annealing uses a scanned line image from a light beam to heat the surface of the wafer to a temperature (the "annealing temperature") for a time long enough to activate the dopants but short enough to minimizing dopant diffusion. The time that the wafer surface is at the annealing temperature is determined by the power density of the line image, as well as by the line-image width divided by the velocity at which the line image is scanned (the "scan velocity").

To achieve high throughput in a commercial LSA tool, the line image needs to be as long and as narrow as possible, while also having a high power density. An example range for usable line-image dimensions is 5 mm to 100 mm in length, by 25 microns to 500 microns in width. To achieve uniform annealing, it is also necessary for the intensity profile along the length of the line image to be as constant as possible. Typical semiconductor processing requirements call for the anneal temperature to be between 1000° C. and 1300° C. with a temperature uniformity of +/−3° C. To achieve this degree of temperature uniformity, the line image formed by the annealing light beam needs to have a relatively uniform intensity, which under most conditions is less than +/−5%.

A $CO_2$ laser is a preferred light source for laser annealing applications because its wavelength (nominally 10.6 microns) is much longer than the size of devices irradiated, resulting in less scatter and more uniform exposure, thereby eliminating "pattern effects," and because it emits a relatively high-intensity beam. However, the coherence length for a $CO_2$ laser is relatively long, typically several meters, making it unfeasible to use a binary optic approach to produce a long, narrow line focus with ~10% (+/−5%) uniformity based on principles of Kohler illumination.

Traditional methods of performing laser annealing with a $CO_2$ laser including imaging the light beam onto a pair of knife-edges. The knife-edges are positioned to transmit only a narrow central portion of a Gaussian light beam. The length of the transmitted light beam is that portion of the beam that meets the uniformity specification for the line image formed at the wafer. For the Gaussian $CO_2$ light beam, the knife edges are typically arranged to pass only the middle 10% of the Gaussian beam. Unfortunately, this means that the other 90% of the light beam is rejected, which is a very inefficient use of the high-intensity light from the light source.

SUMMARY

An aspect of the disclosure is a line-forming optical system for forming a line image for a laser thermal processing system. The line-forming optical system includes, in order along an optical axis: a laser, a first cylindrical lens system, a first spatial filter, a second cylindrical lens system having a second spatial filter, a knife-edge aperture, a cylindrical relay system, and a cylindrical focusing lens. The laser generates in input light beam. The first cylindrical lens system focuses the input light beam to a line focus in a first direction having a central lobe defined by surrounding intensity minima. The first spatial filter is located at the line focus and is configured to truncate the line image in a second direction within the central lobe, thereby forming a first light beam. The second cylindrical lens system is configured to receive and truncate a portion of the first light beam in the second direction to form a second substantially collimated light beam, wherein the truncation is performed by an aperture stop that acts as the second spatial filter. The knife-edge aperture is configured to truncate the second substantially collimated light beam in the second direction to form a third light beam, and in one embodiment the blades that define the knife edges have serrated edges. The cylindrical relay lens system has an image plane conjugate with the knife-edge aperture and is configured to receive the third light beam and form therefrom a fourth light beam that is focused in the second direction to define a line image length LL at the image plane. The cylindrical focusing lens is configured to focus the fourth light beam in the first direction to define a line image width WL at the image plane.

Another aspect of the disclosure is a laser annealing system for annealing a wafer having a surface, wherein the laser annealing system includes the line-forming optical system as described above, and a stage configured to operably support and move the wafer in the image plane so as to scan the line image over the wafer surface.

Another aspect of the disclosure is a method of forming a line image for annealing a wafer having a surface. The method includes generating a light beam, and focusing the light beam form a line focus having a central lobe. The method also includes performing a first spatial filtering of the line focus within the central lobe to form a first spatially filtered elongate light beam. The method also includes propagating the first spatially filtered elongate light beam to a far field location and performing a second spatial filtering of the first spatially filtered beam to form a twice spatially filtered elongate light beam. The method additionally includes truncating the twice-spatially filtered elongate light beam in the elongate direction to form a truncated elongate light beam. The method also includes focusing in at least one direction the truncated light beam, thereby forming the line image on the wafer surface.

Additional features and advantages of the disclosure will be set forth in the detailed description which follows, and in part will be readily apparent to those skilled in the art from that description or recognized by practicing the disclosure as described herein, including the detailed description which follows, the claims, as well as the appended drawings.

It is to be understood that both the foregoing general description and the following detailed description present embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

DETAILED DESCRIPTION

Reference is now made in detail to the present preferred embodiments of the disclosure, examples of which are illustrated in the accompanying drawings. Whenever possible, the same or like reference numbers and symbols are used throughout the drawings to refer to the same or like parts. In the description below, an "elongate" light beam refers to a cross-section of the light beam, wherein one cross-sectional dimension is greater than another.

Figure 1A:
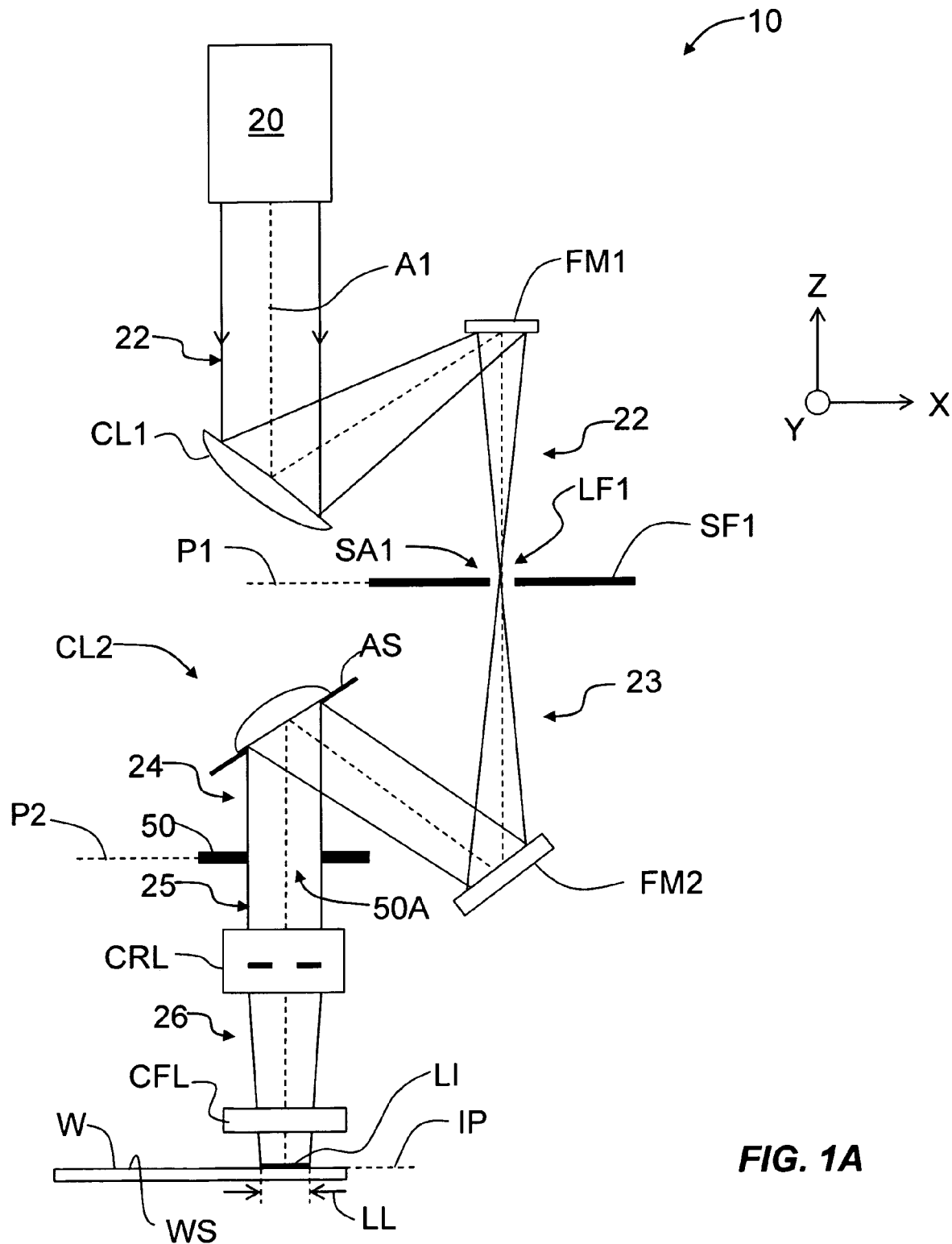
FIG. 1A and FIG. 1B are schematic diagrams of an example line-forming optical system according to the disclosure as viewed in the minus X-direction and minus Y-direction, respectively.
Figure 1B:
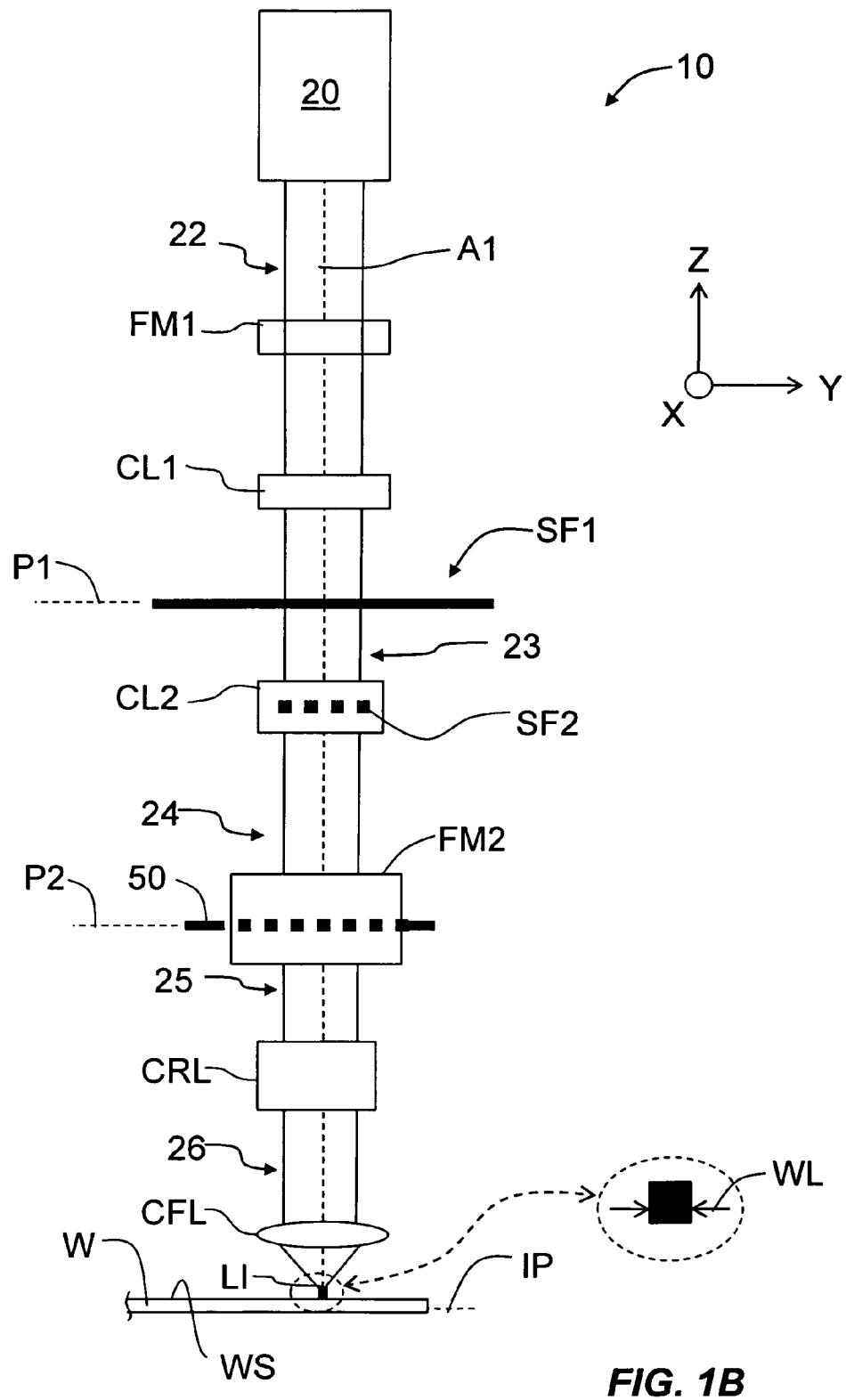

FIG. 1A and FIG. 1B are schematic diagrams of an example line-forming optical system ("system") 10 as viewed in the minus Y-direction and in the minus X-direction, respectively, as indicated by the Cartesian coordinates shown for the sake of reference. System 10 has an optical axis A1 and includes laser 20 that emits an initial collimated and coherent light beam 22, referred to below as the "input light beam." In an example embodiment, laser 20 includes a $CO_2$ laser and light beam 22 has a nominal wavelength of 10.6 microns. Generally, laser 20 can be any laser that generates light beam 22 with a wavelength suitable for laser annealing wafer W. Such annealing may include, for example, heating the wafer, or irradiating the wafer with radiation from another light source, so that the wafer absorbs sufficient amounts of light beam 22 to heat the wafer to annealing temperatures, as discussed in greater detail below.

System 10 also includes, in order along optical axis A1, a first cylindrical lens system CL1 with power in the X-Z plane, a first flat fold mirror FM1, an adjustable first spatial filter SF1 located at plane P1 and having an aperture SA1, a fold mirror FM2, and a cylindrical lens system CL2 with power in the X-Z plane. System 10 also includes an adjustable knife-edge aperture 50 located at a plane P2 and having opening (aperture) 50A. System 10 further includes a cylindrical lens system CRL and a cylindrical focusing lens CFL that forms the final line image LI at plane IP. In an example embodiment, cylindrical lens system CRL is a cylindrical relay lens system.

Cylindrical lens systems CL1, CL2, CRL and CFL may include one or more of cylindrical mirrors and cylindrical lenses, and are shown as single cylindrical mirrors for the sake of illustration. Cylindrical lens systems CL1, CL2, CRL and CFL can also include apertures and like components. Second cylindrical lens CL2 includes an aperture stop AS that defines the pupil for system 10. Also, cylindrical lens system CRL optionally includes a spatial filter SF2. Fold mirrors FM1 and FM2 are optional and are used, for example, to make system 10 more compact, and are generally preferred in mirror-based systems.

Figure 1C:
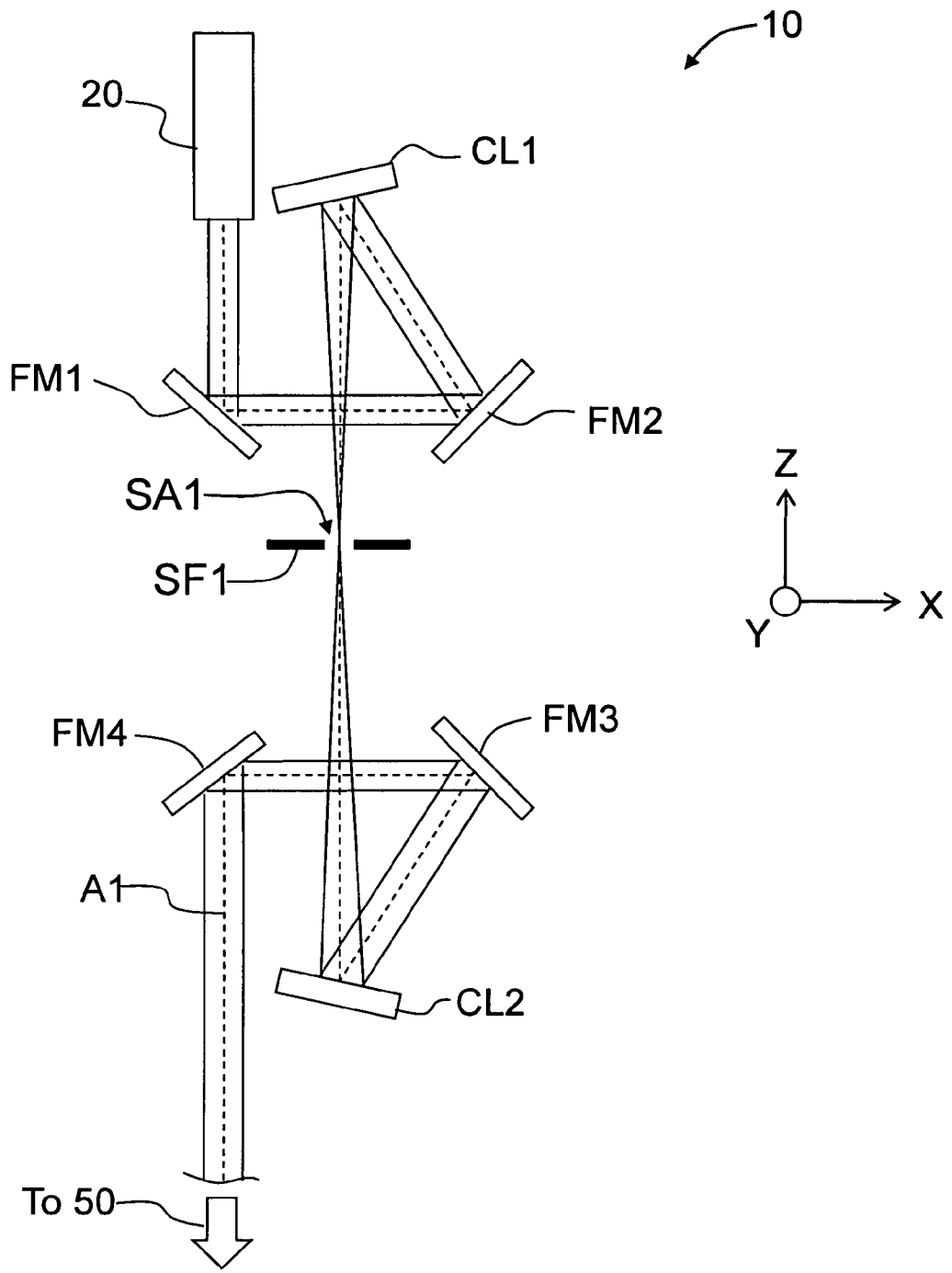
FIG. 1C and FIG. 1D are similar to FIG. 1A and FIG. 1B and illustrate an example system configuration having four fold mirrors.
Figure 1D:
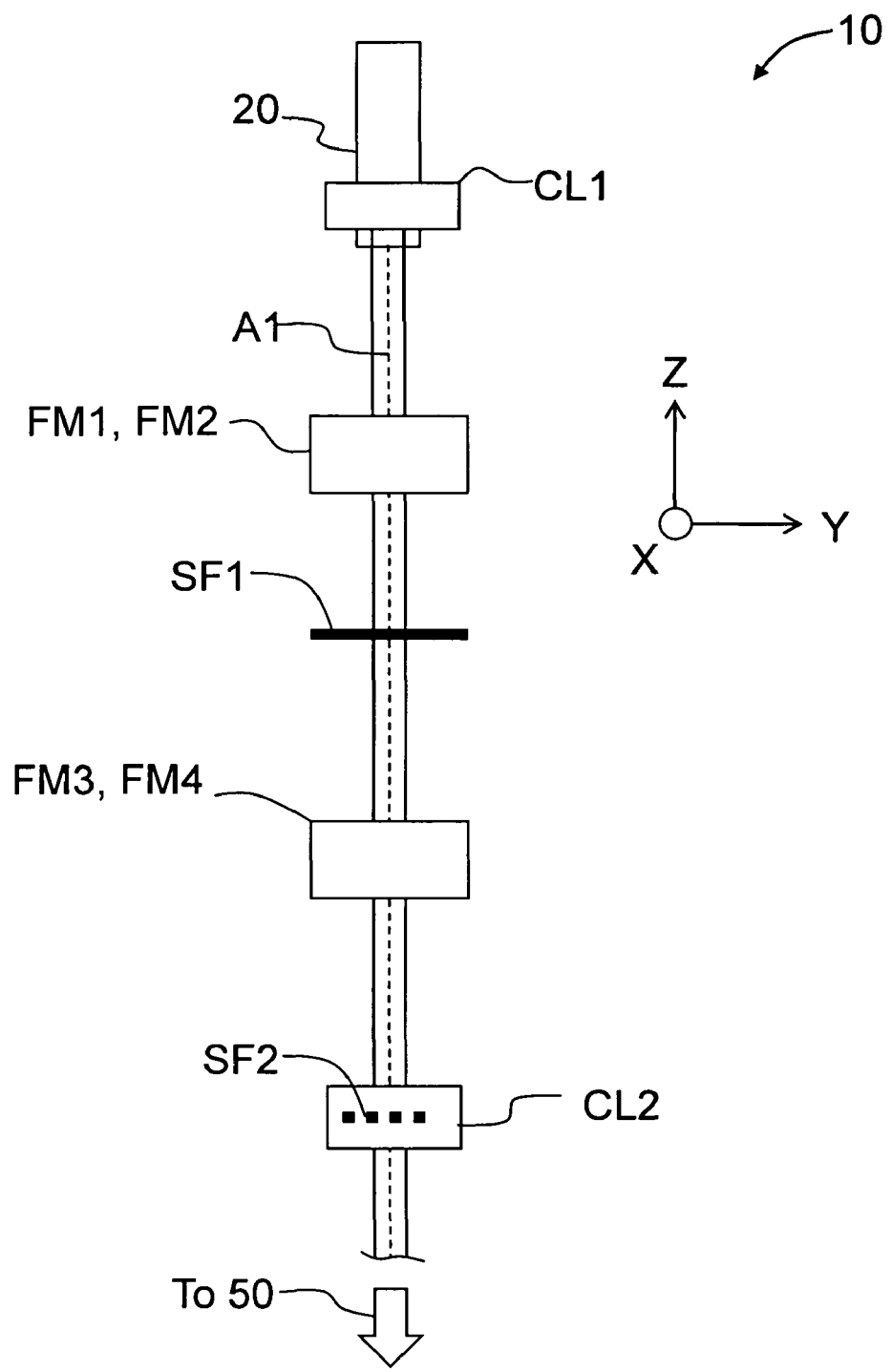

FIG. 1C and FIG. 1D are similar to FIG. 1A and FIG. 1B, and illustrate an example configuration of a portion of system 10 that includes the first spatial filter SF1, wherein the example configuration includes two additional fold mirrors FM3 and FM4.

Figure 2A:
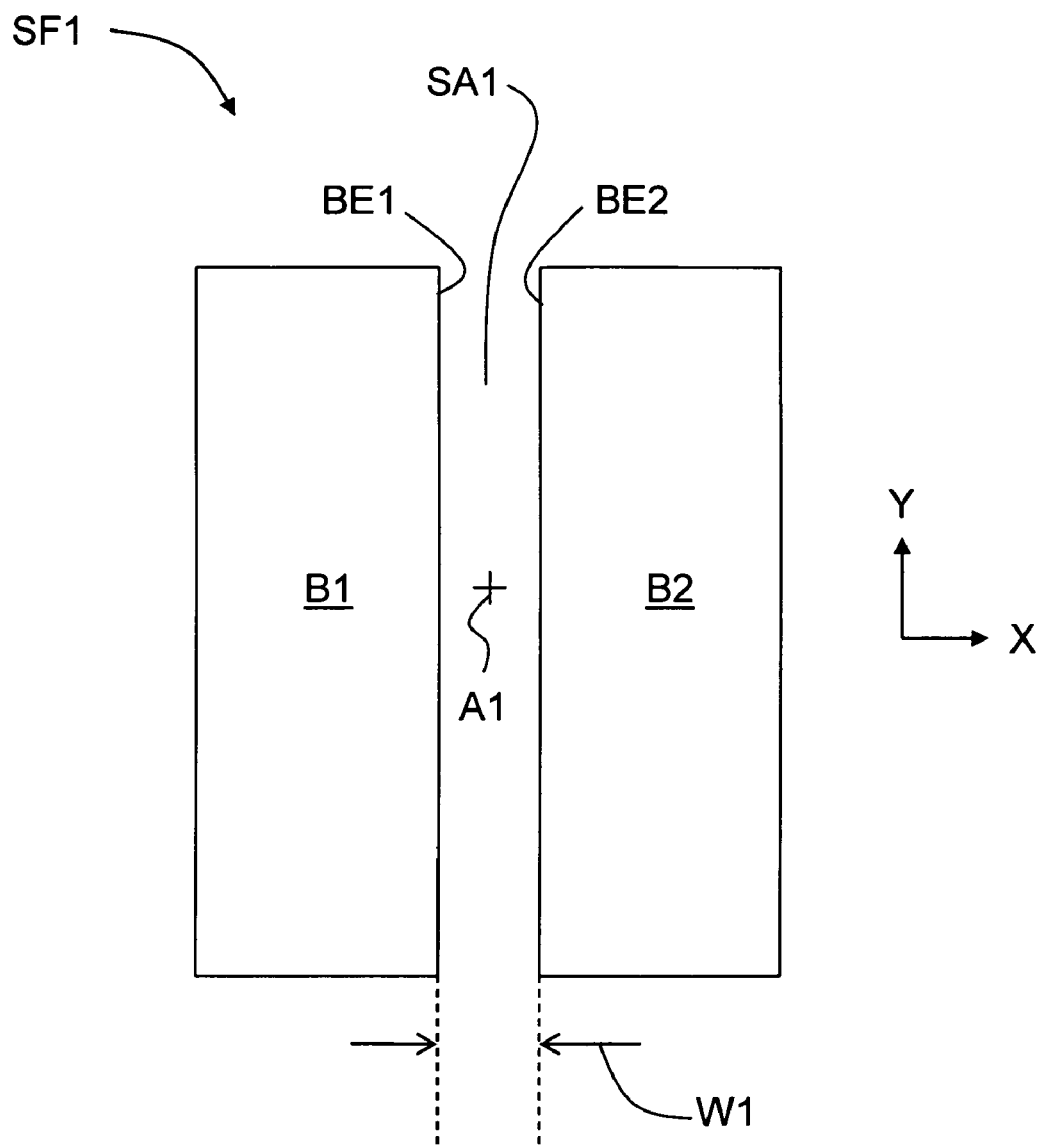
FIG. 2A is a face-on view of an example knife-edge type spatial filter for use as the first spatial filter.

FIG. 2A is a face-on view of an example of spatial filter SF1. The spatial filter includes adjustable blades B1 and B2 with respective edges BE1 and BE2 ("knife edges") that define a slit aperture SA1 that is narrow in the X-direction with a width W1 and that is long in the Y-direction.

Figure 2B:
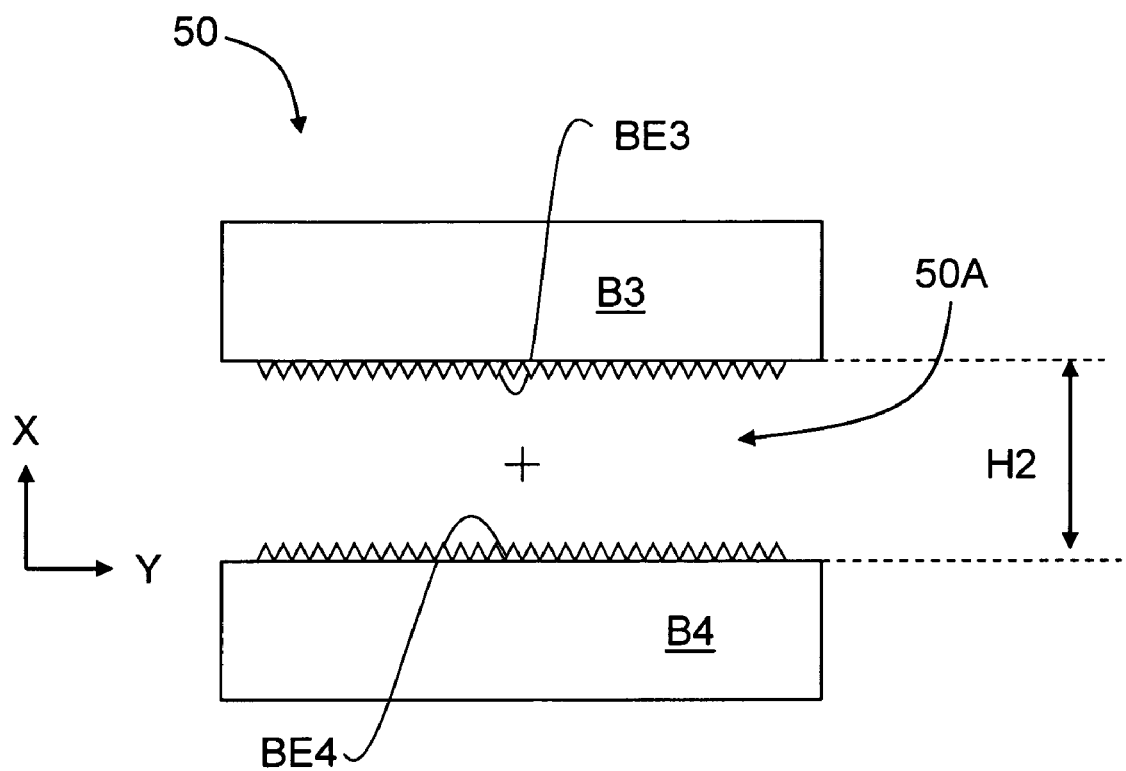
FIG. 2B is a face-on view of an example knife-edge spatial filter for use as the second spatial filter, wherein the knife edges have serrations.

FIG. 2B is similar to FIG. 2A and shows example of knife-edge aperture 50. Knife-edge aperture 50 includes blades B3 and B4 that have respective knife edges BE3 and BE4 that define an aperture 50A with a height H2 in the Y-direction height. Knife edges BE3 and BE4 are shown as being serrated, which serves to reduce diffraction effects.

Figure 3:
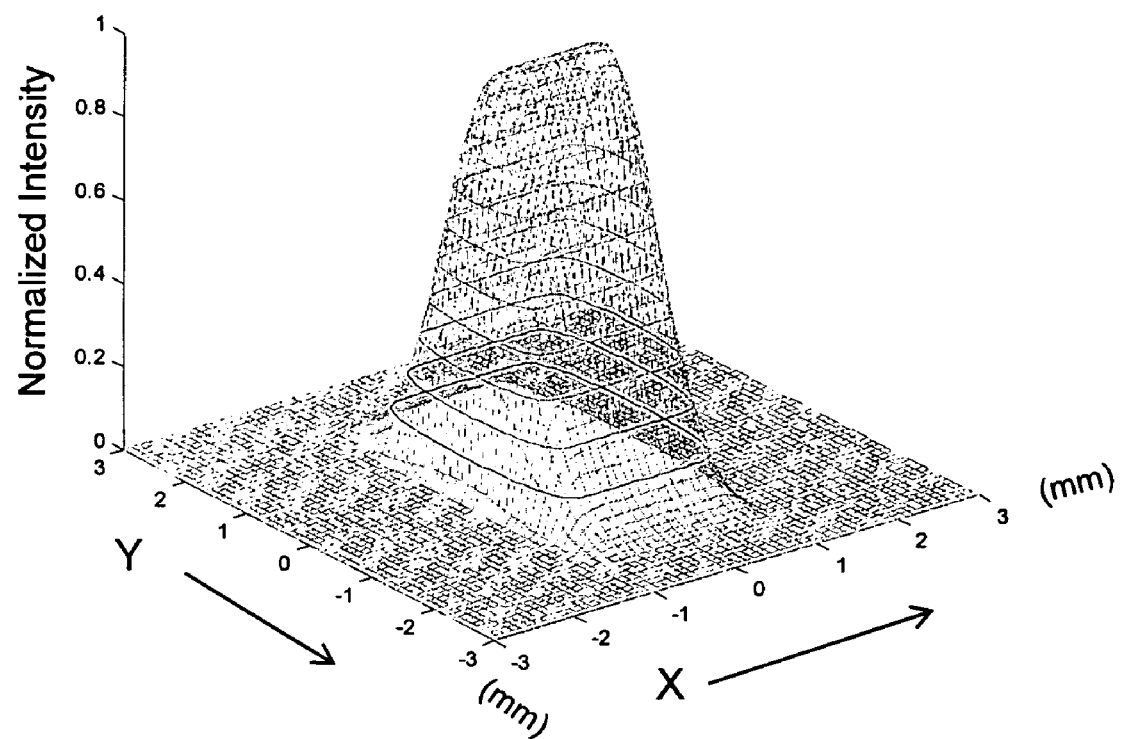
FIG. 3 is a three-dimension (3D) plot of an example intensity distribution of a light beam emitted by the laser, showing a Gaussian shape in the Y-direction and a relatively "flat top" shape in the X-direction (direction dimensions are in mm)

In an example, laser 20 includes a $CO_2$ laser that emits light at a wavelength λ of nominally 10.6 microns. Some $CO_2$ lasers emit output beams that are Gaussian. However, certain high power, single-mode $CO_2$ lasers have an output beam that is non-Gaussian at least in one direction because they employ unstable resonators. FIG. 3 is a three-dimensional (3D) plot of an example intensity distribution of a non-Gaussian light beam 22 as emitted by light source unit 20. The example light beam illustrated in FIG. 3 has a substantially flat top light distribution along the X-direction and a Gaussian distribution in the Y-direction.

In a conventional line-forming optical system, spatial filter SF1 is configured (e.g., width W1 is set) to form from input light beam 22 an output light beam that is Gaussian in the X-direction. In the discussion below, this conventional spatial filter setting involves placing blade edges BE1 and BE2 at the intensity zeroes (or more generally, the intensity minima that define the central lobe) of the light distribution formed at spatial filter SF1 (see FIG. 4, discussed below).

Figure 4A:
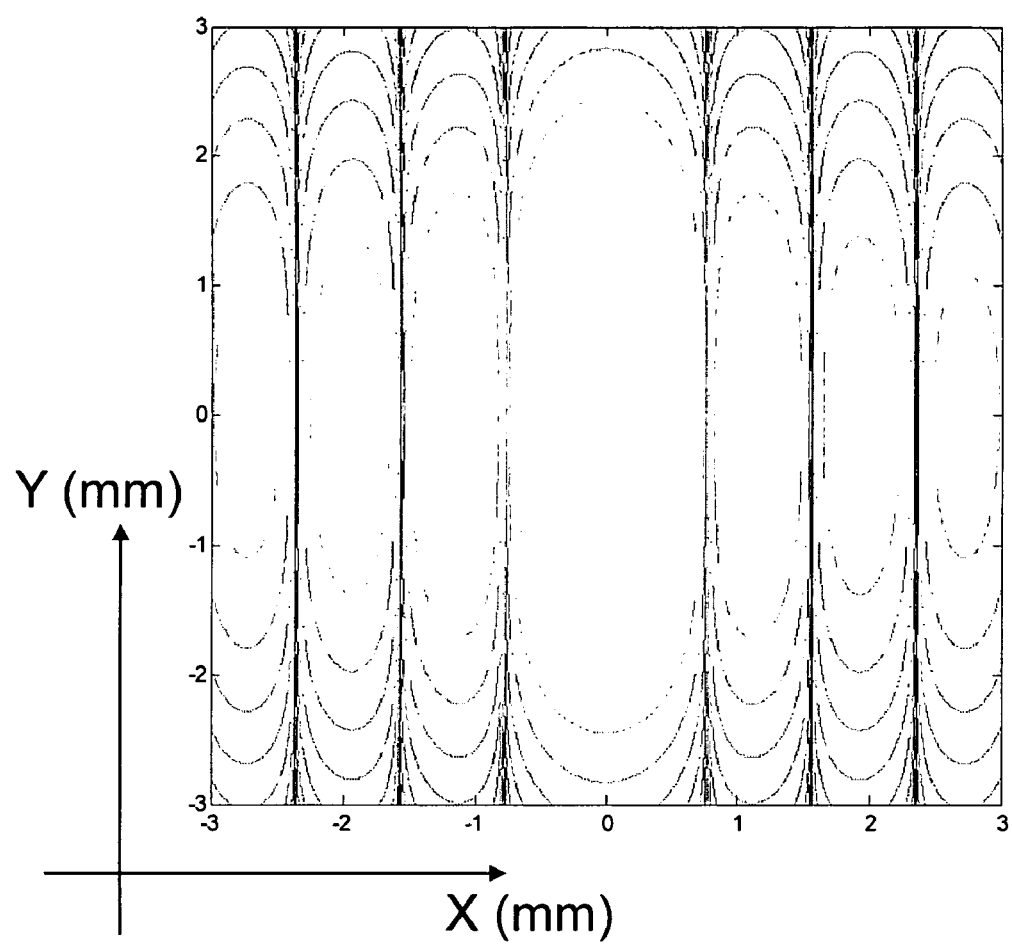
FIG. 4 is a plot of the light intensity distribution in the X-direction (mm) of the focused input light beam at spatial filter SF1 (plane P1), and also illustrates the spatial filter widths W1 associated with forming a Gaussian first output light beam and with forming a non-Gaussian first output light beam.
Figure 4B:
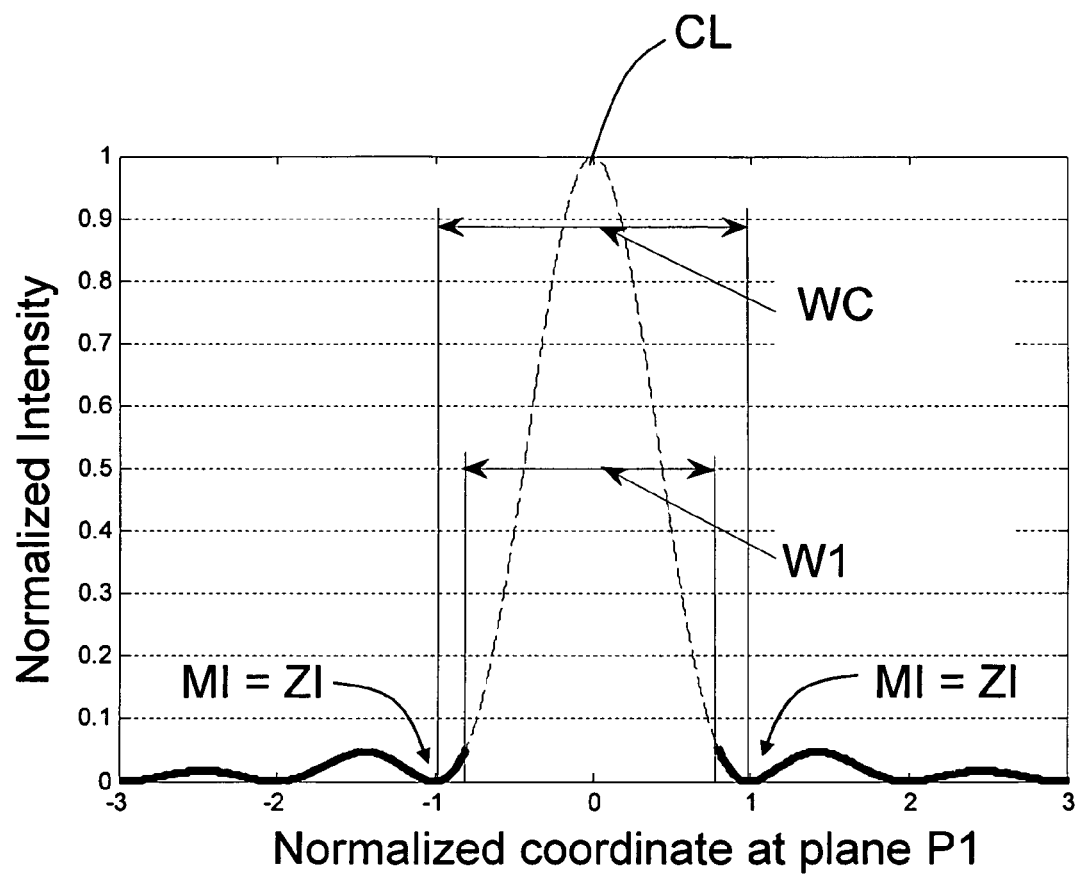

The light distribution of line focus LF1 is defined by the clear aperture and focal length of cylindrical lens system CL1, as well as by the input light intensity distribution (an example of which is shown in FIG. 3). FIG. 4A is a logarithmic contour plot of the light distribution associated with line focus LF1 as spatial filter SF1. FIG. 4B plots the (non-logarithmic) intensity of the line focus in the X-direction. FIG. 4B shows the first intensity minima MI that surround and define a central lobe CL. In an ideal case, the intensity minima are intensity zeroes ZI. Note from FIGS. 4A and 4B that the light distribution in the X-direction is essentially a "sync" function, with the central lobe CL having a width WC as defined by the surrounding intensity minima MI, while the light distribution in the Y-direction maintains its original Gaussian character. The light distribution plot of FIG. 4A shows that light beam 22 is elongate in the Y-direction The plot of FIG. 4B shows superimposed thereon the spatial filter widths W1=WC and W1=0.8WC that correspond to forming Gaussian and non-Gaussian output beams 23 leaving spatial filter SF1.

A spatial filter width W1 that puts blade edges BE1 and BE2 at the first intensity minima MI of the sinc function (i.e., W1=WC) results in a light distribution in light beam 23 in a far field location (e.g., at spatial filter SF2) that is a Fourier transform of the central lobe of the sinc function, which results in a Gaussian-like far-field light distribution. However, the line-forming image system of the present disclosure sets the spatial filter width within the central lobe CL i.e., at W1<WC (e.g., W1 in the range from 0.6WC to 0.9WC, and more preferably in the range from 0.7WC to 0.8WC). This truncates central lobe CL inside of the intensity minima MI, which results in a far-field light distribution for light beam 23 that is the Fourier transform of only a portion of central lobe CL. The effect is to broaden the spatial extent of output light beam 23 in the far field by cutting off more of the higher spatial frequencies in the light beam and imparting more diffraction to the light beam, giving it a much more flat-top shape as compared to a Gaussian light distribution.

Output light beam 23 travels from spatial filter SF1 to cylindrical lens system CL2, where the once-filtered light beam is filtered (truncated) in the X-direction to form a light beam 24. The filtering/truncation function is performed by the size of cylindrical lens system CL2, i.e., this lens system is configured to only passes a portion of light beam 23. Thus, cylindrical lens system CL2 serves as a second spatial filter. Cylindrical lens system CL2 has power in the X-direction and in one example forms light beam 24 as a substantially collimated light beam when light beam 23 is a substantially diverging light beam.

Light beam 24 is directed by cylindrical lens system CL2 to aperture 50, which serves to truncate this light beam in the long (elongate) direction (i.e., the X-direction) to form light beam 25. This truncation helps define the length LL of the final line image LI. Blades B3 and B4 are adjustable to adjust length LL. Aperture 50 is an image plane of cylindrical lens system CL2 with the corresponding object plane being at spatial filter SF1.

Light beam 25 travels to cylindrical lens system CRL, which is configured so that plane P2 and image plane IP are conjugate planes. With reference to FIG. 1A, cylindrical relay lens focuses light beam 25 in the X-direction to form light beam 26, which passes directly through focusing cylindrical lens (which has power in the Y-direction) to form the final line image LI at image plane IP. With reference to FIG. 1B, light beam 26 is focused in the Y-direction by cylindrical focusing lens so that the line image LI has a width W1. A typical width WW for line image LI is in the range from about 25 microns to about 500 microns.

Cylindrical lens systems CL1 and CL2 are arranged relative to spatial filter SF1 so that light beam 22 propagating from the source through cylindrical lens system CL1 to spatial filter SF1 undergoes a Fourier-transform, and the light beam 23 propagating from spatial filter SF1 beyond (to the distance of about CL2' focal length behind) cylindrical lens system CL2 is approximately inverse Fourier transformed.

Figure 5:
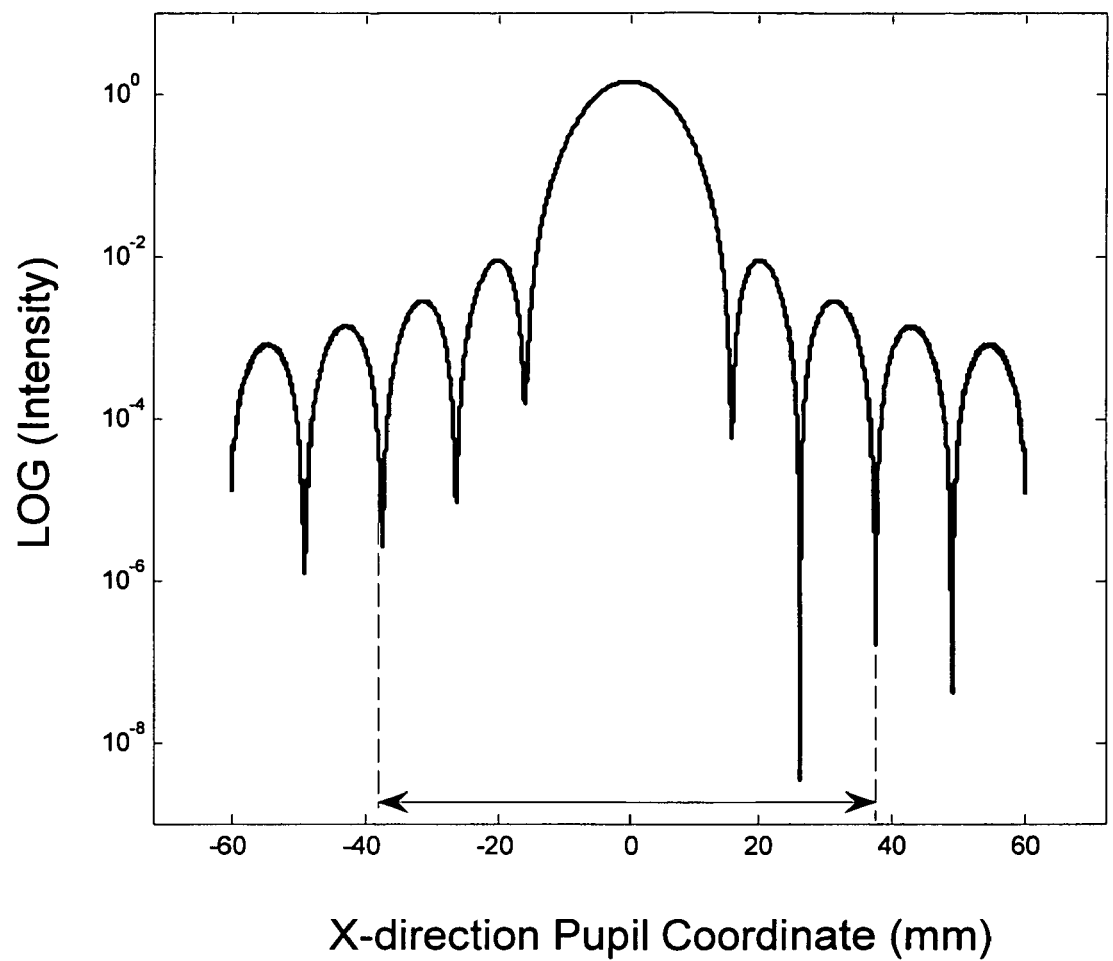
FIG. 5 is a logarithmic plot of the far-field light intensity distribution in the first output light beam at plane P2 and shows an example where cylindrical lens system CL2 is configured to pass the five central lobes in the intensity distribution.

Light beam 23 is spatially filtered by cylindrical lens system CL2 to form a twice spatially filtered light beam 24 that has a light distribution determined by the two filtering steps. The first filtering step creates a broad power spectrum, as illustrated in FIG. 5. Cylindrical lens system CL2 is configured (e.g., by setting an internal aperture or selecting its clear aperture) to select which intensity lobes in the power spectrum are transmitted by the cylindrical lens system to form light beam 24. For example, in FIG. 5, cylindrical lens system CL2 is configured to pass the main (central) lobes and four of the surrounding lobes while blocking multiple outlying intensity lobes. Note that light beam 24 maintains its Gaussian character in the Y-direction.

Figure 6:
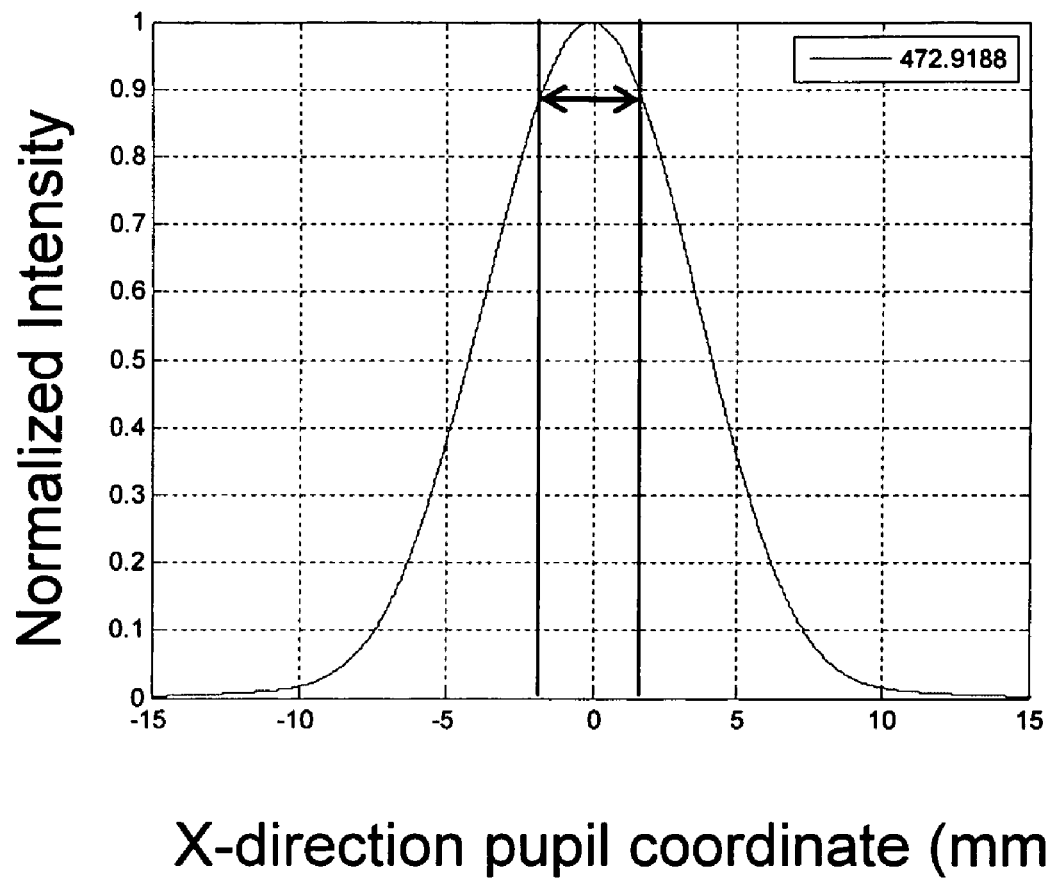
FIG. 6 plots an example far-field normalized intensity versus position in the X-direction (mm) of the first output light beam at plane P2 formed using the conventional approach of setting spatial filter width W1 equal to the central lobe width WC at spatial filter SF1.
Figure 7:
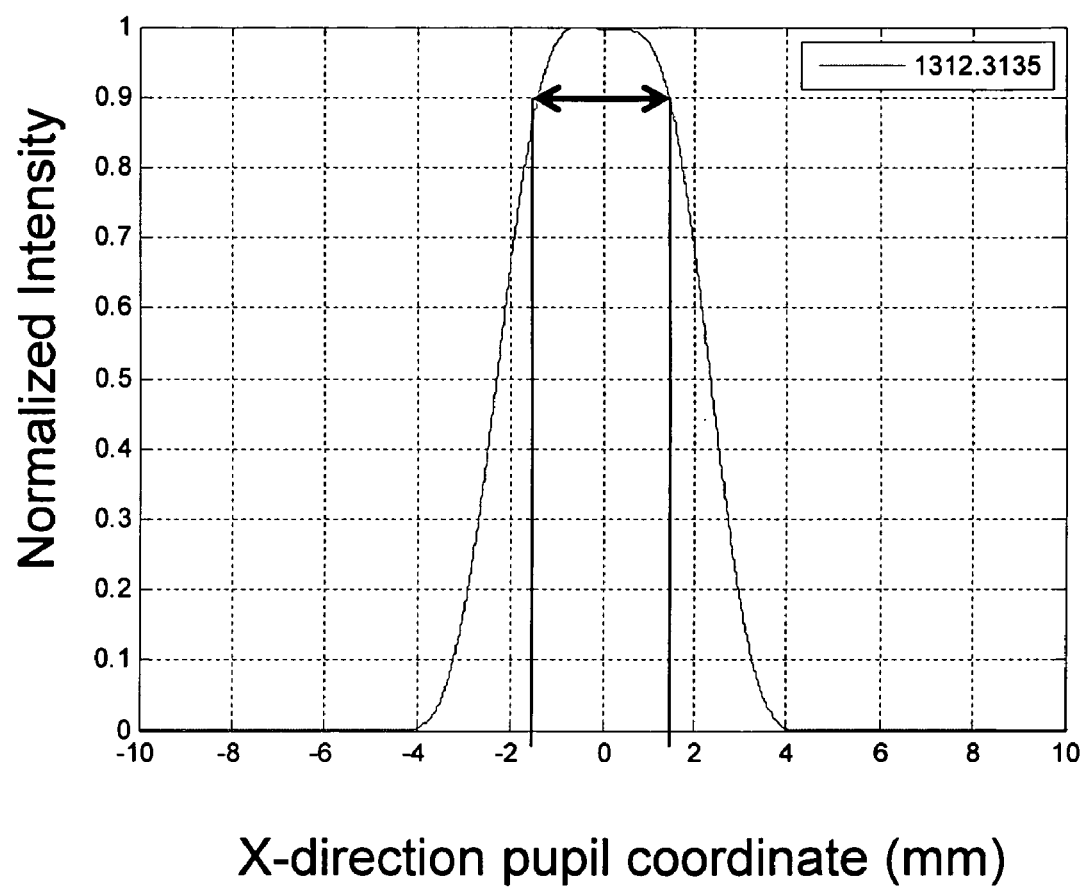
FIG. 7 is a plot similar to FIG. 6, but is based on the line-forming optical system of the present disclosure where W1=0.7WC.

Due to double spatial filtering, the intensity distribution at the knife-edge aperture 50 changes from Gaussian to a "more flat top" distribution (compare FIG. 6 and FIG. 7). Therefore, more power can be transmitted through aperture 50 for forming of the line image. The resultant line image LI is also very uniform in the long direction (e.g., usually better than +/−5%), and does not suffer from interference effects from the coherence of the output beam (this is due to serrations at the knife edge and spatial filter inside the relay or, which is the same, low NA of the relay). The length of line image LI can be made substantially longer than in conventional line-forming systems for laser thermal processing optical systems, (e.g., 3× longer) because system 10 provides more power to form the line image than conventional systems. The line image length LI is selected, for example, by selecting a suitable magnification for cylindrical lens system CRL.

EXAMPLES

As discussed above, conventional line-forming optical systems are optimized to produce a Gaussian light beam, which is then truncated to pass a narrow central portion of the light beam, resulting in a substantial loss of light in the final output light beam.

FIG. 6 plots an example normalized intensity versus position of input light beam 22 at spatial filter SF1 for a conventional line-forming optical system. The spatial filter width W1=WC, which corresponds to forming a substantially Gaussian light beam 23 in the X-direction. In the calculation of the plot of FIG. 6, the spatial filter width W1=WC=2*(λ/D)*F=0.87 mm, where the laser wavelength λ=10.6 microns, the focal length F1 and clear aperture (diameter) D of cylindrical lens system CL1 is F1=900 mm and D=22 mm.

The length LL of line image LI is 7.47 mm and is defined as a normalized intensity of ≧0.9. The power density of the light beam at the image plane (and thus at wafer surface WS) is 63.3 watts/mm$^2$. Conspicuous in the plot of FIG. 7 is the large amount of energy blocked by the spatial filter SF1.

FIG. 7 is a plot similar to FIG. 6, but is based on the line-forming optical system of the present disclosure, with the distance from cylindrical lens system CL2 to aperture 50 is equal to 5 meters, and the overall system magnification is 7.37. The spatial filter width W1=0.7WC, which produces a line image LI having a length of 7.54 mm with a power density of 174 watts/mm$^2$. While this particular example has a line length LL similar to that produced by conventional means, the power density is greater by about a factor of 3×, which represents a substantial increase in the throughput of a laser thermal processing tool. The line length can be increased considerably (e.g., up to about 3×) by changing the system magnification. In an example, 5 mm≦LL≦100 mm. Also in an example, the line image width WL is 25 microns≦WL≦500 microns. Also in an example, the line image LI has a power density in the range from 50 W/mm$^2$ to 5000 W/mm$^2$.

Figure 8A:
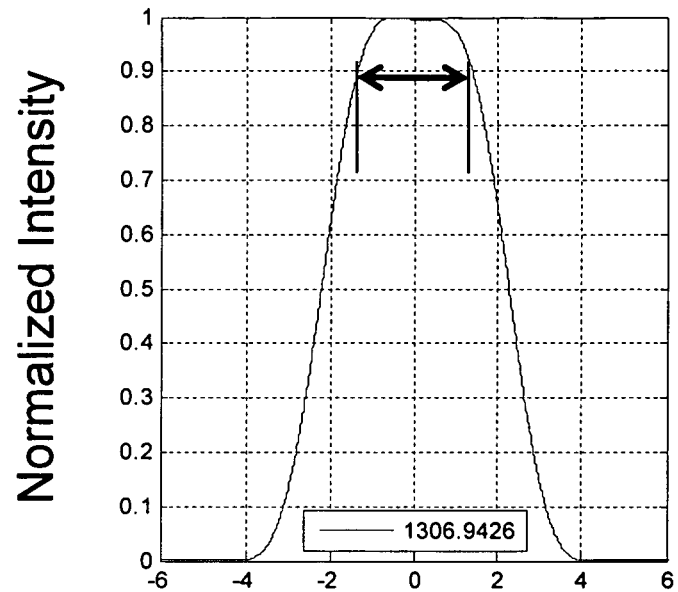
FIGS. 8A and 8B are plots similar to FIG. 7, but that illustrate two different magnifications for the line-forming optical system that produce substantially different line image lengths.
Figure 8B:
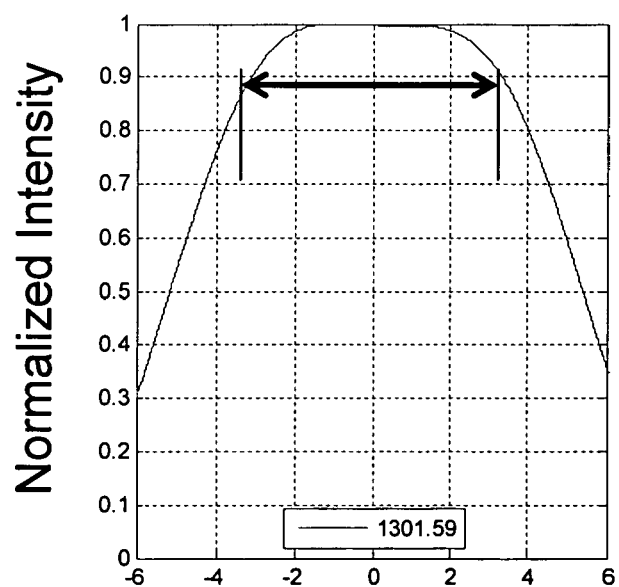

FIG. 8A and FIG. 8B illustrate another example wherein W1=0.7WC. In FIG. 8A, the length of line image LI is 7.3 mm. However, with reference now to FIG. 8B, by changing the distance between spatial filter SF to the pupil (or by increasing the distance between cylindrical lens system CL2 and aperture 50 and reducing the distance between the spatial-filter SF1 and the pupil), the magnification is changed to 16.7, which changes the length LL of line image LI to about 17 mm.

It is noted that the tolerance on the configuration of spatial filter SF1 is relatively forgiving in most instances, with a typical axial placement tolerance of approximately +/−0.5 mm.

Laser Thermal Processing System

Laser annealing in semiconductor processing is typically performed on patterned wafers. The absorption on patterned wafers varies with the pattern dimensions, the pattern density and the laser wavelength. It has been shown that laser annealing with a wavelength much longer than the pattern dimensions is preferable.

Figure 9:
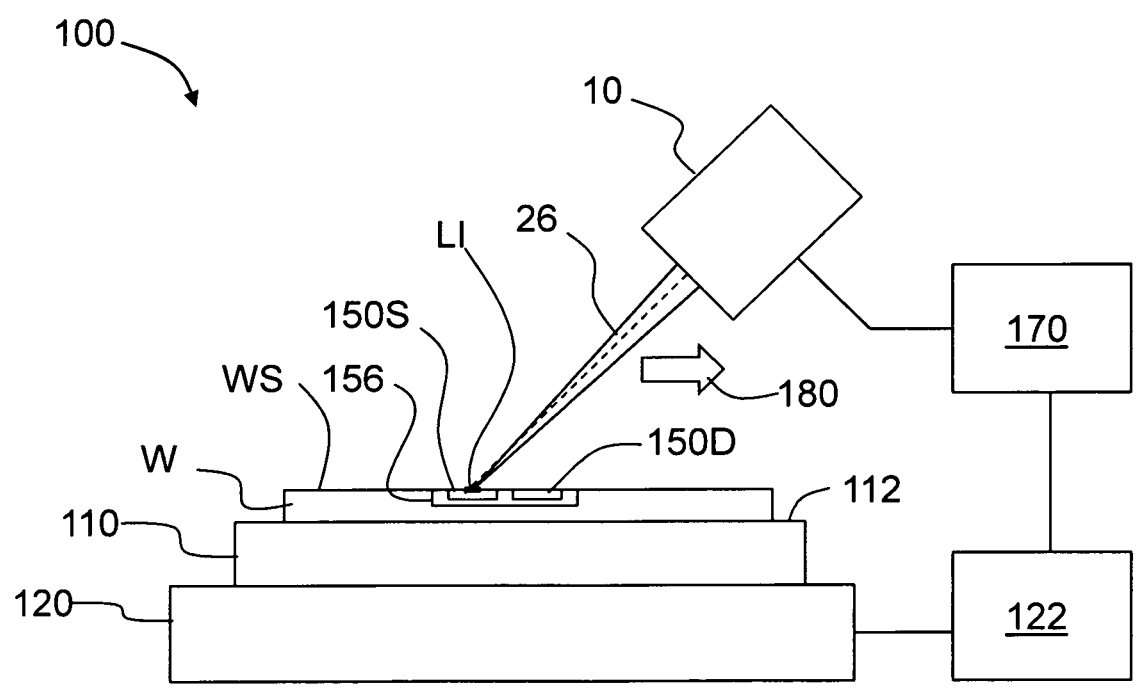
FIG. 9 is a schematic diagram of an example laser thermal processing system that includes the line-forming optical system of the present disclosure.

FIG. 9 is a schematic diagram of a laser annealing system 100 that includes the line-forming optical system of the present disclosure. An example laser annealing system for which the line-forming optical system 10 is suitable for use is described in, for example, U.S. Pat. Nos. 7,612,372; 7,514,305; 7,494,942; 7,399,945; 7,154,066; 6,747,245; and 6,366,308, which patents are incorporated by reference herein.

System 100 of FIG. 9 includes, along optical axis A1, the line-forming optical system 10 as described above, wherein light beam 22 emitted by laser 20 has a wavelength (e.g., nominally 10.6 microns from a $CO_2$ laser) that is absorbed by and is capable of heating wafer W under select conditions. Such conditions include, for example, heating wafer W, or irradiating the wafer with a second radiation beam (not shown) having a bandgap energy greater than the semiconductor bandgap energy of the wafer, thereby causing the wafer to absorb light beam 22 to a degree sufficient to heat the wafer to annealing temperatures. An example of irradiating the wafer with a second light source to make the wafer absorbent to light beam 22 is described in U.S. Pat. Nos. 7,098,155; 7,148,159 and 7,482,254, all of which are incorporated by reference herein.

Wafer W is supported by a chuck 110 having an upper surface 112. In an example, chuck 110 is configured to heat wafer W. Chuck 110 in turn is supported by a stage 120 that in turn is supported by a platen 130. In an example embodiment, chuck 110 is incorporated into stage 120. In another example embodiment, stage 120 is movable, including being translatable and rotatable.

Wafer W is shown by way of example as having source and drain regions 150S and 150D formed at or near wafer surface WS as part of a circuit (e.g., transistor) 156 formed in wafer W. Note that the relative size of the source and drain regions in circuit 156 compared to wafer W are greatly exaggerated in FIG. 10 for ease of illustration. In practice, source and drain regions 150S and 150D are very shallow, having a depth into the substrate of about one micron or less.

In an example embodiment, apparatus 100 further includes a controller 170 electrically connected to laser 20 and to a stage controller 122. Stage controller 122 is electrically coupled to stage 120 and is configured to control the movement of the stage via instructions from controller 170. Controller 170 is configured coupled to control the operation of apparatus 100 generally, and in particular laser 20, stage controller 122.

In an example embodiment, controller 170 is or includes a computer, such as a personal computer or workstation, available from any one of a number of well-known computer companies such as Dell Computer, Inc., of Austin Tex. Controller 170 preferably includes any of a number of commercially available micro-processors, a suitable bus architecture to connect the processor to a memory device, such as a hard disk drive, and suitable input and output devices (e.g., a keyboard and a display, respectively).

With continuing reference to FIG. 9, light beam 26 generated as described above is directed onto wafer surface WS to form line image LI thereon. It is noted that the term "image" is used herein in to generally denote the distribution of light formed by light beam 26 at image plane IP and wafer surface WS residing therein. Thus, line image LI does not necessarily have an associated "object" in the classical sense.

In an example embodiment, line image LI is scanned over wafer surface WS, as indicated by arrow 180, resulting in rapid heating of the wafer surface (down to a depth of about 1 micron or less) up to a temperature (e.g., between 1000° C. and 1,300° C.) sufficient to activate dopants in the source and drain regions 150S and 150D, while also allowing for rapid cooling of the wafer surface so that the dopants do not substantially diffuse, thereby maintaining the shallowness of the source and drain regions. A typical scan velocity of line image LI over wafer surface WS ranges from 25 mm/sec to 1000 mm/sec. In an example, one or both of light beam 26 and wafer W can move during scanning. Because line-forming optical system 10 can form a relatively long line image LI having a relatively large power density, wafer W can be scanned much faster (e.g., up to 3× faster or have 3× longer process line for 3× throughput improvement) than previous line-image forming optical systems would allow, thereby increasing the number of wafer per hour that can be processed by apparatus 10.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A line-forming optical system for forming a line image for a laser thermal processing system, comprising in order along an optical axis:
   a laser that generates an input light beam;
   a first cylindrical lens system that focuses the input light beam to a line focus in a first direction having a central lobe defined by surrounding intensity minima;
   a first spatial filter located at the line focus and configured to truncate the line image in a second direction within the central lobe, thereby forming a first light beam;
   a second cylindrical lens system configured to receive and truncate a portion of the first light beam in the second direction to form a second substantially collimated light beam;
   a knife-edge aperture configured to truncate the second substantially collimated light beam in the second direction to form a third light beam;
   a third cylindrical lens system having an image plane conjugate with the knife-edge aperture and configured to receive the third light beam and form therefrom a fourth light beam that is focused in the second direction to define a line image length LL at the image plane; and a fourth cylindrical lens system that focuses the fourth light beam in the first direction to define a line image width WL at the image plane.

2. The system of claim 1, wherein the second cylindrical lens system performs the truncation of the first light beam by a) an aperture stop sized to perform said truncation or b) a clear aperture sized to perform said truncation.

3. The system of claim 1, wherein the knife-edge aperture includes opposing serrated blade edges.

4. The system of claim 1, wherein the line image length LL is in the range from 5 mm$\leq$LL$\leq$100 mm.

5. The system of claim 1, wherein the line image width WL is in the range from 25 microns$\leq$WL$\leq$500 microns.

6. The system of claim 1, wherein the third cylindrical lens system comprises a cylindrical relay lens system having an aperture stop that defines a second spatial filter.

7. The system of claim 1, wherein the central lobe of the line focus has a width WC, and wherein the first spatial filter has as width W1 such that 0.6WC$\leq$W1$\leq$0.9WC.

8. The system of claim 1, wherein the laser is a $CO_2$ laser that generates the light beam to have a nominal wavelength of 10.6 microns.

9. The system of claim 1, wherein the first light beam has a plurality of intensity lobes at the first spatial filter, including a central intensity lobe and surrounding intensity lobes, and wherein second cylindrical lens system is configured to transmit the central intensity lobe and multiple surrounding intensity lobes while blocking multiple surrounding intensity lobes.

10. The method of claim 1, wherein the line image has a power density in the range from 50 W/mm$^2$ to 5000 W/mm$^2$.

11. A laser annealing system for annealing a wafer having a surface, comprising:

the line-forming optical system of claim 1; and a stage configured to operably support and move the wafer in the image plane so as to scan the line image over the wafer surface.

12. A method of forming a line image for annealing a wafer having a surface, comprising:

generating an input light beam;

focusing the input light beam form a line focus having a central lobe;

performing a first spatial filtering of the line focus within the central lobe to form a first light beam;

propagating the first light beam to a far field location and performing a second spatial filtering of the first light beam to form a twice spatially filtered second light beam;

truncating the second light beam in an elongate direction to form a third light beam; and focusing in at least one direction the third light beam to form the line image on the wafer surface.

13. The method of claim 12, further comprising focusing the truncated elongate light beam in a second direction when forming the line image.

14. The method of claim 12, including performing the second spatial filtering using a cylindrical optical system having an aperture stop.

15. The method of claim 12, wherein the line image has a length LL in the range from 5 mm$\leq$LL$\leq$100 mm and a width WL in the range from 25 microns$\leq$WL$\leq$500 microns.

16. The method of claim 12, wherein the central lobe has a width WC defined by surrounding intensity minima, and including carrying out the first spatial filtering with an aperture having a width W1 such that 0.6WC$\leq$W1$\leq$0.9WC.

17. The method of claim 12, wherein generating the input light beam includes forming the input light beam to have a nominal wavelength of 10.6 microns.

18. The method of claim 12, wherein the first light beam has at the far field location a plurality of intensity lobes including a central intensity lobe and surrounding intensity lobes, and further comprising performing the second spatial filtering to transmit the central intensity lobe and multiple surrounding intensity lobes while blocking multiple surrounding intensity lobes.

19. The method of claim 12, further comprising moving the wafer relative to the line image, thereby scanning the line image over the wafer surface.

20. The method of claim 11, further comprising providing the line image with a power density in the range from 50 W/mm$^2$ to 5000 W/mm$^2$.

* * * * *

UNITED STATES PATENT AND TRADEMARK OFFICE
CERTIFICATE OF CORRECTION

PATENT NO. : 8,014,427 B1  
APPLICATION NO. : 12/800203  
DATED : September 6, 2011  
INVENTOR(S) : Serguei Anikitchev Page 1 of 1

It is certified that error appears in the above-identified patent and that said Letters Patent is hereby corrected as shown below:

In the Specification

In column 4, line 40, replace "Y-direction" with -- X-direction --

Signed and Sealed this
Twenty-fourth Day of June, 2014

Michelle K. Lee
*Deputy Director of the United States Patent and Trademark Office*